United States Patent
Omori et al.

(10) Patent No.: US 9,876,481 B2
(45) Date of Patent: Jan. 23, 2018

(54) MICROWAVE PROCESSING DEVICE

(71) Applicant: Panasonic Intellectual Property Management Co., Ltd., Osaka-shi, Osaka (JP)

(72) Inventors: Yoshiharu Omori, Shiga (JP); Tomotaka Nobue, Nara (JP); Hiroshi Kawai, Shiga (JP); Koji Yoshino, Shiaga (JP); Keijirou Kunimoto, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 372 days.

(21) Appl. No.: 14/426,034

(22) PCT Filed: Dec. 6, 2013

(86) PCT No.: PCT/JP2013/007200
§ 371 (c)(1),
(2) Date: Mar. 4, 2015

(87) PCT Pub. No.: WO2014/087666
PCT Pub. Date: Jun. 12, 2014

(65) Prior Publication Data
US 2015/0288342 A1    Oct. 8, 2015

(30) Foreign Application Priority Data
Dec. 7, 2012    (JP) ................... 2012-267919

(51) Int. Cl.
*H05B 6/64* (2006.01)
*H05B 6/72* (2006.01)
(Continued)

(52) U.S. Cl.
CPC ............. *H03H 7/38* (2013.01); *H05B 6/6408* (2013.01); *H05B 6/6494* (2013.01); *H05B 6/662* (2013.01);
(Continued)

(58) Field of Classification Search
CPC ........ H05B 6/70; H05B 6/6494; H05B 6/702; H05B 6/662; H05B 6/664; H05B 6/6408; H03H 7/38
(Continued)

(56) References Cited

U.S. PATENT DOCUMENTS

| | | |
|---|---|---|
| 4,121,078 A | 10/1978 | Takano et al. |
| 4,695,693 A | 9/1987 | Staats et al. |
| 2014/0327597 A1* | 11/2014 | Rashidian ............ H01Q 9/0485 343/905 |

FOREIGN PATENT DOCUMENTS

| | | |
|---|---|---|
| GB | 2 081 559 A | 2/1982 |
| JP | 49-16944 A | 2/1974 |

(Continued)

OTHER PUBLICATIONS

Extended Search Report for corresponding European Application No. 13 86 0191.9 dated Nov. 20, 2015, 8 pages.
(Continued)

*Primary Examiner* — Quang Van
(74) *Attorney, Agent, or Firm* — Brinks Gilson & Lione

(57) ABSTRACT

A microwave processing device includes: a periodic structure body which forms a surface-wave transmission line to transmit surface waves of microwaves; an oscillator which generates microwave power; and a transmitting part which transmits the microwave power generated by the oscillator to the periodic structure body, wherein a matching part is provided at a connecting portion between the periodic structure body and the transmitting part, and an impedance
(Continued)

of the matching part is set to a value between an impedance of the periodic structure body and an impedance of the transmitting part.

12 Claims, 4 Drawing Sheets

(51) Int. Cl.
*H05B 6/70* (2006.01)
*H03H 7/38* (2006.01)
*H05B 6/66* (2006.01)

(52) U.S. Cl.
CPC ............... *H05B 6/664* (2013.01); *H05B 6/70* (2013.01); *H05B 6/702* (2013.01)

(58) Field of Classification Search
USPC ....... 219/704, 705, 709, 710, 720, 739, 741, 219/742, 746, 747, 750, 753, 764, 778, 219/696; 333/33, 247, 219, 204, 164; 29/593; 343/905
See application file for complete search history.

(56) References Cited

FOREIGN PATENT DOCUMENTS

| JP | 51-11242 A | 1/1976 |
| JP | S51-128038 A | 11/1976 |
| JP | 55-51312 B2 | 12/1980 |
| JP | 61-237393 A | 10/1986 |
| JP | 61-243692 A | 10/1986 |
| JP | 4-61476 B2 | 11/1986 |
| JP | 62-8493 A | 1/1987 |
| JP | 63-46550 B2 | 9/1988 |

OTHER PUBLICATIONS

International Preliminary Report on Patentability and Written Opinion in corresponding International Application No. PCT/JP2013/007200, dated Jun. 18, 2015, 8 pages.
International Search Report, and English language translation thereof, in corresponding International Application No. PCT/JP2013/007200, dated Mar. 4, 2014, 5 pages.

* cited by examiner

MICROWAVE PROCESSING DEVICE

This application is a 371 application of PCT/JP2013/007200 having an international filing date of Dec. 6, 2013, which claims priority to JP 2012-267919 filed Dec. 7, 2012, the entire contents of which are incorporated herein by reference.

TECHNICAL FIELD

The present invention relates to a microwave processing device having a periodic structure body which forms a surface-wave transmission line to transmit surface waves of microwaves.

BACKGROUND ART

A conventional microwave processing device of this kind is provided with a coaxial cable and a periodic structure body. The coaxial cable supplies microwave energy therethrough, and the periodic structure body is supplied with the microwave energy from the coaxial cable and has an interdigital tape line formed therein (see, for example, Patent Document 1). The microwave processing device of Patent Document 1 has a resonant hole defined in an end of the interdigital tape line. In this configuration, an object to be heated is uniformly heated by microwave heating from the resonant hole, while browning the object using microwaves produced in the interdigital tape line.

In another microwave processing device, microwaves are emitted and transmitted through an interdigital tape line formed by a periodic structure body (see, for example, Patent Document 2). Even a thick object to be heated is efficiently microwave-heated by emitting and transmitting the microwaves through the interdigital tape line.

PATENT DOCUMENTS

Patent Document 1: Japanese Laid-Open Patent Publication No. S61-237393
Patent Document 2: Japanese Patent Publication No. H04-61476

SUMMARY OF THE INVENTION

Problems to be Solved by the Invention

In the above-described conventional configurations, however, when microwave power is transmitted from a transmitting part such as a coaxial cable to the periodic structure body having the surface-wave transmission line such as the interdigital tape line, more efficient transmission of the microwave power to the periodic structure body is required.

The present invention has been developed to solve the above-described conventional problem and is intended to provide a microwave processing device capable of efficiently transmitting microwave power to a periodic structure body having a surface-wave transmission line.

Means to Solve the Problems

In solving the above-described conventional problem, a microwave processing device includes: a periodic structure body which forms a surface-wave transmission line to transmit surface waves of microwaves; an oscillator which generates microwave power; and a transmitting part which transmits the microwave power generated by the oscillator to the periodic structure body, wherein a matching part is provided at a connecting portion between the periodic structure body and the transmitting part, and an impedance of the matching part is set to a value between an impedance of the periodic structure body and an impedance of the transmitting part.

Effects of the Invention

The microwave processing device of the present invention can efficiently transmit microwave power to a periodic structure body having a surface-wave transmission line.

BRIEF DESCRIPTION OF THE DRAWINGS

These aspects and features of the present invention will become apparent from the following description of preferred embodiments thereof with reference to the accompanying drawings.

DETAILED DESCRIPTION OF THE PREFERRED EMBODIMENTS

Figure 1:
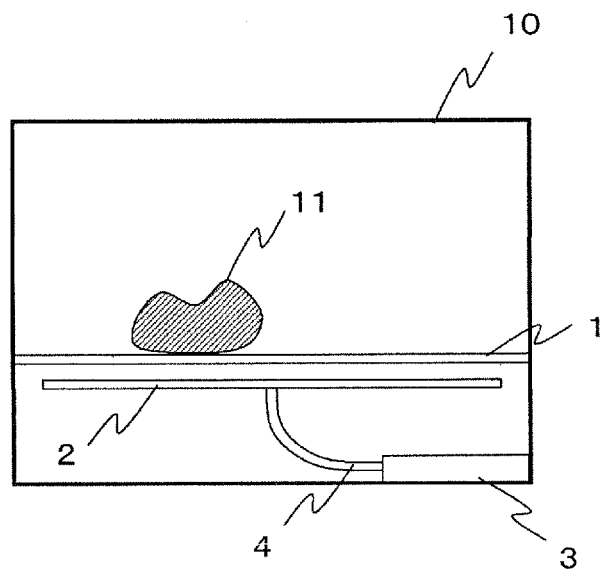
FIG. 1 is a schematic cross-sectional view of a microwave processing device according to a first embodiment of the present invention.

A first invention is a microwave processing device including: a periodic structure body which forms a surface-wave transmission line to transmit surface waves of microwaves; an oscillator which generates microwave power; and a transmitting part which transmits the microwave power generated by the oscillator to the periodic structure body, wherein a matching part is provided at a connecting portion between the periodic structure body and the transmitting part, and an impedance of the matching part is set to a value between an impedance of the periodic structure body and an impedance of the transmitting part. This configuration allows the matching part to achieve impedance matching between the transmitting part and the periodic structure body to reduce reflection of microwaves that may occur at the connecting portion between the transmitting part and the periodic structure body, thus making it possible to efficiently transmit the microwave power from the transmitting part to the periodic structure body.

A second invention is a microwave processing device of the first invention, wherein the matching part forms a microstrip line in which at least a portion of the periodic structure body acts as a ground surface. This configuration can further simplify and downsize the matching part.

A third invention is a microwave processing device of the first invention, wherein the matching part has an impedance-changing portion that is positioned such that reflection waves of microwaves created at the impedance-changing portion at least partially cancel reflection waves of microwaves created at the connecting portion between the periodic structure body and the matching part. This configuration at least partially cancels the reflection of the microwaves created at the connecting portion between the transmitting part and the periodic structure body, thereby transmitting the microwaves efficiently from the transmitting part to the periodic structure body.

A fourth invention is a microwave processing device of the third invention, wherein changing of a shape of the matching part forms the impedance-changing portion of the matching part. Thus, the microwaves can be transmitted efficiently from the transmitting part to the periodic structure body.

A fifth invention is a microwave processing device of the third invention, wherein the matching part forms a microstrip line having a dielectric body in which at least a portion of the periodic structure body acts as a ground surface, and wherein the dielectric body of the microstrip line has a dielectric-constant changing portion, which forms the impedance-changing portion of the matching part. Thus, the microwaves can be transmitted efficiently from the transmitting part to the periodic structure body.

A sixth invention is a microwave processing device of the first invention, wherein the periodic structure body comprises a first metallic plate having a first comb-shaped portion and a second metallic plate having a second comb-shaped portion positioned to face the first comb-shaped portion, wherein the surface-wave transmission line is an interdigital line between the first and second comb-shaped portions, wherein the transmitting part comprises a coaxial cable which has a central conductor and a casing to cover the central conductor, and wherein the central conductor of the coaxial cable is connected to the first comb-shaped portion of the periodic structure via the matching part, and the casing of the coaxial cable is connected to the second metallic plate of the periodic structure body. This configuration can reduce a thickness of the periodic structure body, thereby reducing the size of the microwave processing device.

A seventh invention is a microwave processing device of the first invention, wherein the periodic structure body comprises a plurality of metallic plates aligned parallel to one another at regular intervals, and one of the plurality of metallic plates is spaced from a supporting body that supports other metallic plates, wherein the transmitting part comprises a coaxial cable which has a central conductor and a casing to cover the central conductor, and wherein the central conductor is connected via the matching part to the metallic plate spaced from the supporting body, and the casing is connected to the supporting body. Thus, the microwaves can be transmitted efficiently from the transmitting part to the periodic structure body.

A eighth invention is a microwave processing device of any one the first invention to the seventh invention, further comprising an object table which is disposed adjacent to the surface-wave transmission line to place an object to be heated thereon, wherein the periodic structure body is disposed with respect to the object table on a side opposite to a side where the object to be heated is placed, and wherein at least one of the matching part and the transmitting part is disposed with respect to the periodic structure body on a side opposite to a side where the object to be heated and the object table are placed. This configuration can make efficient use of a space that is not used for cooking, thus making it possible to reduce the size of the microwave processing device.

First and second embodiments of the present invention are described hereinafter with reference to the drawings, but the present invention is not limited by the first and second embodiments.

Embodiment 1

FIG. 1 is a schematic cross-sectional view of a microwave processing device according to a first embodiment of the present invention.

As shown in FIG. 1, the microwave processing device is provided with an object table 1, a periodic structure body 2, an oscillator 3, and a transmitting part 4. The object table 1 is to place an object 11 to be heated thereon. The periodic structure body 2 is disposed adjacent to the object table 1. The oscillator 3 generates microwave power. The transmitting part 4 connects the periodic structure body 2 and the oscillator 3 with each other. The oscillator 3 for generating microwave power includes a magnetron and/or semiconductors, for example, and the microwave power generated by the oscillator 3 is transmitted to the periodic structure body 2 via the transmitting part 4. The periodic structure body 2 is a structure in which substantially the same slits, structures or the like are arrayed at regular intervals to concentrate microwaves, which has been transmitted by the transmitting part 4, in a near space.

The object 11 to be heated is placed on the object table 1 adjacent to the periodic structure body 2 and will be strongly heated by the microwaves concentrated by the periodic structure body 2, thereby making it possible to brown a surface of the object 11 to be heated.

The above-described components of the microwave processing device such as the object table 1, the periodic structure body 2 and the like are disposed within a heating chamber 10 of the microwave processing device, but they need not to be always disposed within the heating chamber 10 as long as the microwave processing device has a construction that causes no risk of radio-waves leakage, electric shock or the like.

Figure 2:
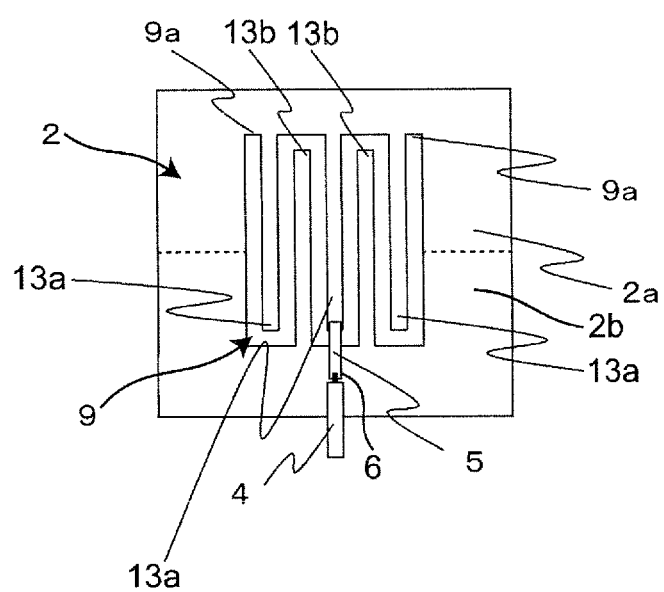
FIG. 2 is a bottom plan view of a periodic structure body of the microwave processing device according to the first embodiment.

FIG. 2 is a bottom plan view of the periodic structure body 2 of the microwave processing device according to the first embodiment.

As shown in FIG. 2, the periodic structure body 2 is formed by a pair of thin metallic plates 2a, 2b having a slit formed therein so as to periodically make U-turns. In the first embodiment, the pair of metallic plates 2a, 2b are integrally formed with each other, and the metallic plate 2a occupies an upper half of the periodic structure body 2 shown in FIG. 2 and the metallic plate 2b occupies a lower half of the periodic structure body 2. The slit, which periodically makes U-turns in the periodic structure body 2, forms a surface-wave transmission line 9. As shown in FIG. 2, the metallic plates 2a, 2b have a pair of comb-shaped portions 13a, 13b facing each other, respectively. In the first embodiment, the comb-shaped portion 13a of the metallic plate 2a is made up of three metallic plates extending downward in FIG. 2, and the comb-shaped portion 13b of the metallic plate 2b is made up of two metallic plates extending upward in FIG. 2. The surface-wave transmission line 9 formed as a space between the comb-shaped portion 13a and the comb-shaped portion 13b is an interdigital line.

Although in the first embodiment ending terminals 9a of the surface-wave transmission line 9 are short-circuited, they are not limited to such a case and may be opened.

Figure 3:
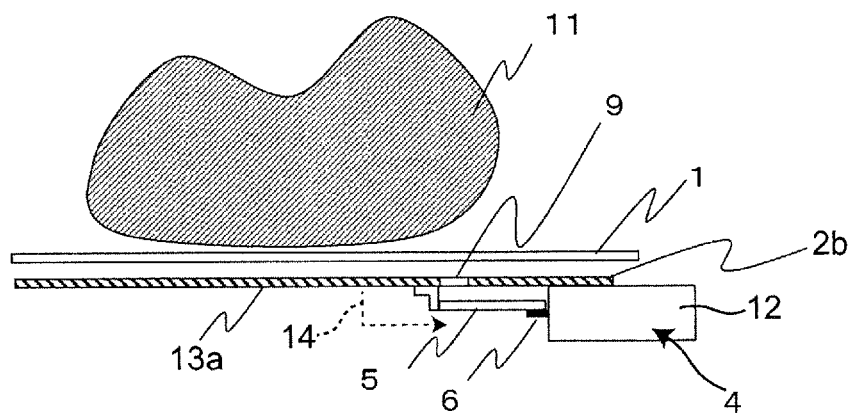
FIG. 3 is a cross-sectional view of the microwave processing device according to the first embodiment.

FIG. 3 is an enlarged cross-sectional view of the microwave processing device according to the first embodiment.

As shown in FIG. 3, the transmitting part 4 according to the first embodiment is a coaxial cable having a central conductor 6 and a casing 12 to cover the central conductor 6. As shown in FIG. 2 and FIG. 3, a matching circuit (a matching part) 5 is provided between the central conductor 6 of the transmitting part 4 and the comb-shaped portion 13a of the metallic plate 2a. That is, the central conductor 6 of the transmitting part 4 is connected to the comb-shaped portion 13a of the metallic plate 2a via the matching circuit 5. The casing 12 of the transmitting part 4 is connected to a portion of the metallic plate 2b that faces the comb-shaped portion 13a connected to the matching circuit 5 (see FIG. 2). In such a connecting relation between the periodic structure body 2 and the transmitting part 4, microwave power is supplied from the transmitting part 4 to the periodic structure body 2, thereby creating an electric field in the surface-wave transmission line 9. The surface-wave transmission line 9 acts as a slow-wave circuit by appropriately setting a length, width, interval, or the like of the slit. Thus, microwaves supplied to the surface-wave transmission line 9 propagate as surface waves having microwave power that reduces in an exponential fashion in a direction perpendicular to a plane including the surface-wave transmission line 9.

In most cases, an impedance (for example, 50Ω) of the transmitting part 4 is smaller than an impedance (for example, 150Ω) of the periodic structure body 2, and the former is not equal to the latter. Accordingly, if the transmitting part 4 is directly connected to the periodic structure body 2 without the matching circuit 5, large reflection of microwaves may occur at a connecting portion between the transmitting part 4 and the periodic structure body 2 due to their impedance mismatching. The microwave reflection may cause not only a reduction in transmission efficiency of microwave power but also failure of the oscillator 3 or the transmitting part 4. The microwave reflection may also cause emission of microwaves into the heating chamber 10.

For this reason, the microwave processing device according to the first embodiment is provided with the matching circuit 5 at the connecting portion between the periodic structure body 2 and the transmitting part 4, i.e., at the impedance mismatching part. Further, the impedance of the matching circuit 5 is set to a value (for example, 100Ω) between the impedance of the periodic structure body 2 and the impedance of the transmitting part 4. The use of the matching circuit 5 to achieve the impedance matching can suppress generation of reflection waves 14 of the microwaves (see FIG. 3) or the emission of the microwaves, thus making it possible to enhance the transmission efficiency of microwave power. That is, the microwave power can be efficiently transmitted from the transmitting part 4 to the periodic structure body 2.

Also, a temperature rise or failure of the oscillator 3 or the transmitting part 4 can be inhibited by suppressing the generation of the reflection waves 14 of the microwaves or the emission of the microwaves, thus making it possible to reduce a size of a cooling structure for the oscillator 3 or the transmitting part 4 and enhance reliability of the microwave processing device.

The matching circuit 5 according to the first embodiment is formed by a metallic plate. This matching circuit 5 forms a microstrip line in which the periodic structure body 2 (at least a portion of the periodic structure body 2) connected to the casing 12 of the transmitting part 4 acts as a ground surface. A dielectric body in the microstrip line is air existing between the periodic structure body 2 and the matching circuit 5. The impedance of the matching circuit 5 is defined by a width of the metallic plate forming the matching circuit 5, a distance between the periodic structure body 2 acting as the ground surface and the matching circuit 5, a material of the dielectric body, and the like. As described above, in the first embodiment, setting the impedance of the matching circuit 5 to the value between the impedance of the transmitting part 4 and the impedance of the periodic structure body 2 can make a stepwise impedance change between the periodic structure body 2 and the transmitting part 4, thereby making it possible to suppress the generation of the reflection waves 14 of the microwaves or the emission of the microwaves.

If the impedance of the matching circuit 5 is set to an average value of the impedance of the transmitting part 4 and the impedance of the periodic structure body 2, the generation of the reflection waves 14 of the microwaves or the emission of the microwaves can be further suppressed. However, the present invention is not limited to such a case and the impedance of the matching circuit 5 may be set to a value between the impedance of the transmitting part 4 and the impedance of the periodic structure body 2. Alternatively, the impedance from the transmitting part 4 to the periodic structure body 2 may be smoothed by changing the width of the metallic plate or the distance between the metallic plate and the ground surface in the matching circuit 5 to become continuous, for example, thereby making it possible to maximally suppress the generation of the reflection waves 14 of the microwaves or the emission of the microwaves.

Also, in the first embodiment, the matching circuit 5 and the transmitting part 4 are placed in a space below the periodic structure body 2, the space being not used in cooking the object 11 to be heated. That is, the periodic structure body 2 is placed with respect to the object table 1 on a side (lower side in FIG. 3) opposite to a side where the object 11 to be heated is placed, while the matching circuit 5 and the transmitting part 4 are placed with respect to the periodic structure body 2 on a side (lower side in FIG. 3) opposite to a side where the object 11 to be heated and the object table 1 are placed. This configuration can effectively make use of the void space below the object table 1 and reduce the size of the microwave processing device.

As just described, the microwave processing device according to the first embodiment is provided with a periodic structure body 2 having a surface-wave transmission line 9 through which surface waves produced by microwaves are transmitted, an oscillator 3 for generating microwave power, and a transmitting part 4 for transmitting the microwave power generated by the oscillator 3 to the periodic structure body 2. A matching part 5 is provided at a connecting portion between the periodic structure body 2 and the transmitting part 4, and the impedance of the matching part 5 is set to a value between the impedance of the periodic structure body 2 and the impedance of the transmitting part 4. The presence of the matching circuit 5 at the connecting portion between the periodic structure body 2 and the transmitting part 4 can achieve impedance matching at the connecting portion where impedance mismatching may occur, thereby making it possible to suppress the reflection waves 14 of the microwaves generated at the connecting portion and to more efficiently transmit the microwave power from the transmitting part 4 to the periodic structure body 2. Accordingly, not only can the object 11 be efficiently browned by the surface waves of the microwaves, but the size of the microwave processing device can be also reduced.

(Variation 1)

Figure 4:
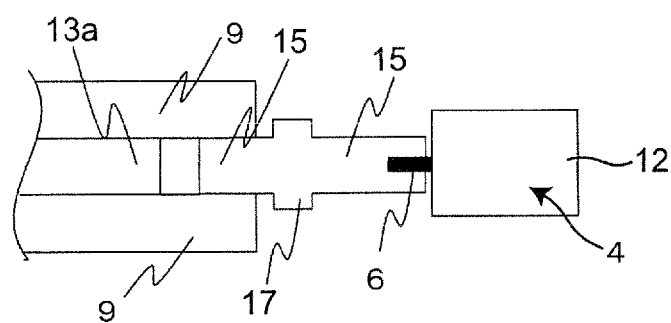
FIG. 4 is a bottom plan view of a matching circuit of a microwave processing device according to a first variation of the first embodiment.
Figure 5:
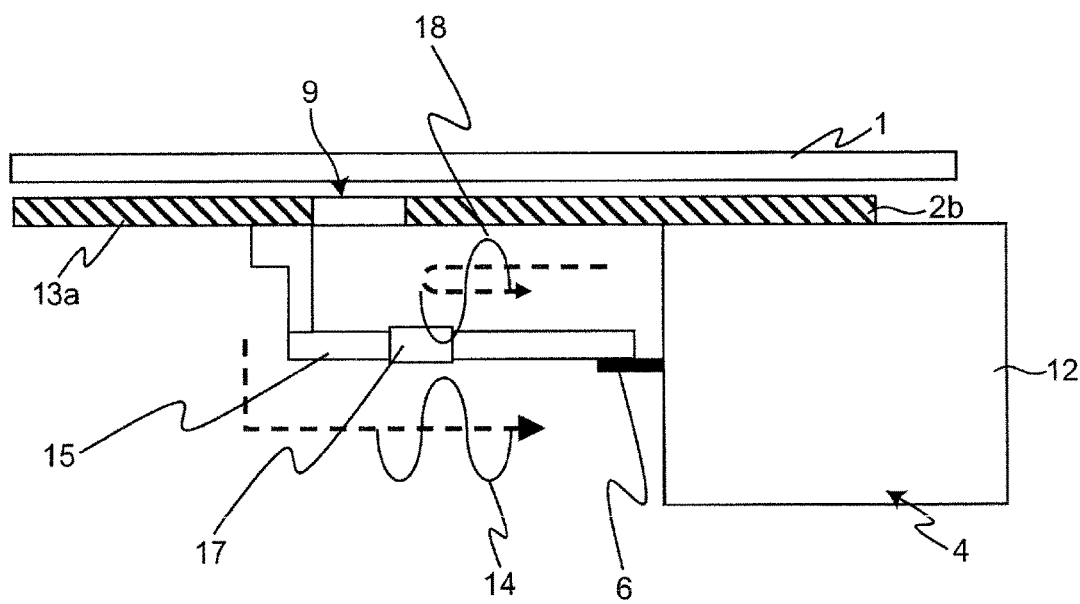
FIG. 5 is a cross-sectional view of the matching circuit of the microwave processing device according to the first variation of the first embodiment.

FIG. 4 is a bottom plan view of a matching circuit 15 of a microwave processing device according to a first variation of the first embodiment. FIG. 5 is a cross-sectional view of the matching circuit 15 of the microwave processing device according to the first variation. The first variation shown in FIG. 4 and FIG. 5 differs from the first embodiment shown in FIG. 1 to FIG. 3 only in shape of matching circuit, and the other configurations of the microwave processing device are the same.

In the first variation, as shown in FIG. 4 and FIG. 5, the matching circuit 15 formed by a metallic plate has a tab 17 of a different width formed at an intermediate portion in a longitudinal direction thereof (a horizontal direction in FIG. 4 and FIG. 5). The tab 17 protrudes in a width direction at the intermediate portion of the matching circuit 15 to form an impedance-changing portion (that is, the tab 17) in the longitudinal direction of the matching circuit 15.

As shown in FIG. 5, reflection waves 18 of microwaves are created at the impedance-changing portion formed by the tab 17 at the intermediate portion of the matching circuit 15. In the first variation, a position and a shape of the tab 17 are regulated so that the reflection waves 18 of the microwaves created by the tab 17 may have an opposite phase to that of the reflection waves 14 of the microwaves created at the connecting portion between the periodic structure body 2 and the transmitting part 4. Thus, the reflection waves 14 of the microwaves created at the connecting portion between the periodic structure body 2 and the transmitting part 4 are at least partially cancelled by the reflection waves 18, thereby making it possible to suppress the generation of the reflection waves 14 of the microwaves or the emission of the microwaves and to more efficiently transmit the microwave power from the transmitting part 4 to the periodic structure body 2.

(Variation 2)

Figure 6:
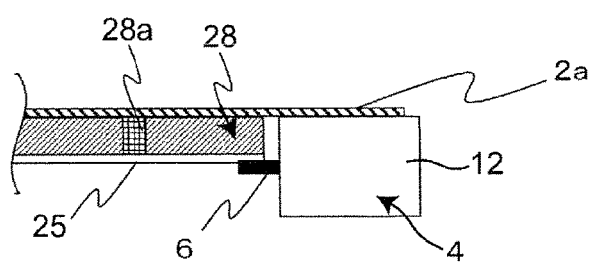
FIG. 6 is a cross-sectional view of a matching circuit of a microwave processing device according to a second variation of the first embodiment.

FIG. 6 is a cross-sectional view of a matching circuit 25 of a microwave processing device according to a second variation of the first embodiment. In the second variation shown in FIG. 6, a microstrip line, in which the periodic structure body 2 (at least a portion thereof) acts as a ground surface, is provided with a dielectric body 28 different from air at a location between the matching circuit 25 and the periodic structure body 2. Also, in the second variation, another dielectric body 28a having a different dielectric constant is provided at an intermediate portion of the dielectric body 28 in a longitudinal direction thereof. The dielectric body 28a has an impedance different from that of the other portions of the dielectric body 28. That is, the dielectric body 28a forms an impedance-changing portion in the matching circuit 25.

In the impedance-changing portion formed by the dielectric body 28a, reflection waves of the microwaves transmitted from the transmitting part 4 are created. In the second variation, as in the first variation, materials, positions, shapes and the like of the dielectric bodies 28, 28a are regulated so that the reflection waves of the microwaves created by the impedance-changing portion may have an opposite phase to that of the reflection waves of microwaves created at the connecting portion between the periodic structure body 2 and the transmitting part 4. Thus, the reflection waves of the microwaves created at the connecting portion between the periodic structure body 2 and the transmitting part 4 are at least partially cancelled, thereby making it possible to suppress the generation of the reflection waves of the microwaves or the emission of the microwaves and to more efficiently transmit the microwave power from the transmitting part 4 to the periodic structure body 2.

Embodiment 2

Figure 7:
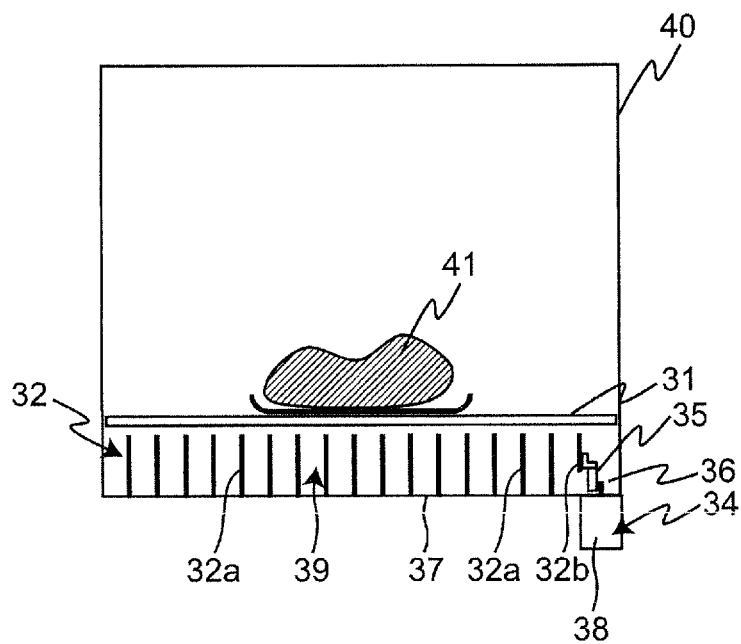
FIG. 7 is a cross-sectional view of a microwave processing device according to a second embodiment of the present invention.
Figure 8:
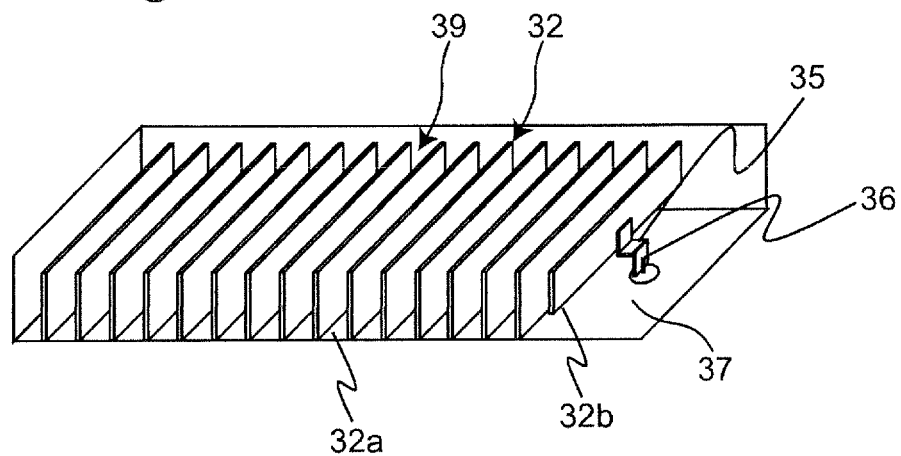
FIG. 8 is a perspective view of a periodic structure body of the microwave processing device according to the second embodiment.

A microwave processing device according to a second embodiment of the present invention is explained hereinafter with reference to FIG. 7 and FIG. 8. The second embodiment differs from the first embodiment mainly in configuration of periodic structure body forming surface-wave transmission line.

A periodic structure body 32 of the microwave processing device according to the second embodiment is made up of a plurality of metallic plates 32a, 32b aligned parallel to one another at regular intervals within a heating chamber 40. The plurality of metallic plates 32a are supported from below by a supporting body 37 and only one metallic plate 32b is spaced from the supporting body 37. The metallic plate 32b spaced from the supporting body 37 is provided with a matching circuit 35. The matching circuit 35 is connected to a central conductor 36 of a transmitting part 34. A casing 38 of the transmitting part 34 is connected to the supporting body 37.

In such a configuration also, microwave power is transmitted from the transmitting part 34 to the periodic structure body 32 via the matching circuit 35 to create an electric field in a surface-wave transmission line 39 formed between the metallic plates 32a, 32b of the periodic structure body 32. Accordingly, in the surface-wave transmission line 39, surface waves can be produced by microwaves. The surface waves act to heat an object 41 to be heated placed on an object table 31 so as to brown it.

In the second embodiment also, as in the first embodiment, the impedance of the matching circuit 35 is set to a value between the impedance of the periodic structure body 32 (in particular, the metallic plate 32b) and the impedance of the transmitting part 34. The use of the matching circuit 35 at a connecting portion between the periodic structure body 32 and the transmitting part 34 can achieve impedance matching at the connecting portion where impedance mismatching may occur, thereby making it possible to suppress reflection waves of microwaves that may be created at the connecting portion and to more efficiently transmit the microwave power from the transmitting part 34 to the periodic structure body 32. Accordingly, not only can the object 41 be efficiently browned by the surface waves of the microwaves, but the size of the microwave processing device can be also reduced.

It is to be noted that the present invention is not limited to the configurations referred to above, but is practicable in various configurations. For example, in the first embodiment, the metallic plate 2a and the metallic plate 2b have been described as being integrally formed with each other in the periodic structure body 2, but not limited to such a case, the metallic plate 2a and the metallic plate 2b may be formed separately, for example.

Also, in the first and second embodiments the transmitting part 4 has been described as being a coaxial cable, but not limited to such a case, the transmitting part 4 may be a microstrip line or a strip transmission line, for example.

Further, in the first variation of the first embodiment the tab 17 has been described as an increase in width at the intermediate portion of the matching circuit 5 to form the impedance-changing portion, but the present invention is not limited to such a case. The impedance-changing portion may be provided, for example, by reducing the width of the matching circuit 5 or by changing the thickness of the matching circuit 5, or by using any other method to change the shape of the matching circuit 5.

Also, in the first and second embodiments the components of the microwave processing device have been described as being disposed within the heating chamber 10, but the present invention is not limited to such a case. The components of the microwave processing device may be disposed in an open space instead of within the heating chamber 10 as long as the microwave processing device may have a construction that causes no risk of radio-waves leakage, electric shock or the like.

Any combination of the various embodiments referred to above can produce respective effects.

As described above, the microwave processing device according to the present invention has a surface-wave transmission line formed by a periodic structure body to transmit surface waves produced by microwaves to efficiently transmit microwave power to the periodic structure body. Accordingly, the microwave processing device according to the present invention is applicable to a heating device as represented by a microwave oven that makes use of dielectric heating, a garbage disposer, a stove, a hot plate or the like.

Although the present invention has been fully described by way of preferred embodiments with reference to the accompanying drawings, it is to be noted here that various changes and modifications will be apparent to those skilled in the art. Therefore, unless such changes and modifications otherwise depart from the scope of the present invention as set forth in the appended claims, they should be construed as being included therein.

The contents of a specification, drawings and claims of a Japanese patent application No. 2012-267919 filed Dec. 7, 2012 are herein expressly incorporated by reference in their entirety.

What is claimed is:

1. A microwave processing device comprising:
   a periodic structure body configured to form a surface-wave transmission line to transmit surface waves of microwaves;
   an oscillator configured to generate microwave power; and
   a transmitting part configured to transmit the microwave power generated by the oscillator to the periodic structure body,
   wherein a matching part is located at a connecting portion between the periodic structure body and the transmitting part, and an impedance of the matching part has a value between an impedance of the periodic structure body and an impedance of the transmitting part,
   wherein the matching part has an impedance-changing portion located such that reflection waves of microwaves created at the impedance-changing portion at least partially cancel reflection waves of microwaves created at the connecting portion between the periodic structure body and the matching part,
   wherein a region having a variation in an otherwise uniform shape of the matching part forms the impedance-changing portion of the matching part, and
   wherein the matching part comprises a metallic plate having a tab of a width different from the metallic plate at an intermediate portion in a longitudinal direction thereof.

2. The microwave processing device according to claim 1, wherein the matching part comprises a microstrip line in which at least a portion of the periodic structure body is a ground surface.

3. The microwave processing device according to claim 2, further comprising an object table adjacent to the surface-wave transmission line and configured to support an object to be heated thereon,
   wherein the periodic structure body is on a side of the object table opposite to a side that supports the object, and
   wherein at least one of the matching part and the transmitting part are located on a side of the periodic structure body opposite to a side where the object and the object table are located.

4. The microwave processing device according to claim 1, wherein the periodic structure body comprises a plurality of metallic plates aligned parallel to one another at regular intervals, and one of the plurality of metallic plates is spaced from a supporting body that supports other metallic plates,
   wherein the transmitting part comprises a coaxial cable which has a central conductor and a casing to cover the central conductor, and
   wherein the central conductor is connected via the matching part to the metallic plate spaced from the supporting body, and the casing is connected to the supporting body.

5. The microwave processing device according to claim 4, further comprising an object table which is disposed adjacent to the surface-wave transmission line to place an object to be heated thereon,
   wherein the periodic structure body is disposed with respect to the object table on a side opposite to a side where the object to be heated is placed, and
   wherein at least one of the matching part and the transmitting part is disposed with respect to the periodic structure body on a side opposite to a side where the object to be heated and the object table are placed.

6. The microwave processing device according to claim 1, further comprising an object table adjacent to the surface-wave transmission line and configured to support an object to be heated thereon,
   wherein the periodic structure body is on a side of the object table opposite to a side that supports the object, and
   wherein at least one of the matching part and the transmitting part are located on a side of the periodic structure body opposite to a side where the object and the object table are located.

7. The microwave processing device according to claim 1, further comprising an object table adjacent to the surface-wave transmission line and configured to support an object to be heated thereon,
   wherein the periodic structure body is on a side of the object table opposite to a side that supports the object, and
   wherein at least one of the matching part and the transmitting part are located on a side of the periodic structure body opposite to a side where the object and the object table are located.

8. The microwave processing device according to claim 1, further comprising an object table adjacent to the surface-wave transmission line and configured to support an object to be heated thereon,
   wherein the periodic structure body is on a side of the object table opposite to a side that supports the object, and wherein at least one of the matching part and the transmitting part are located on a side of the periodic structure body opposite to a side where the object and the object table are located.

9. A microwave processing device comprising:
a periodic structure body configured to form a surface-wave transmission line to transmit surface waves of microwaves;
an oscillator configured to generate microwave power; and
a transmitting part configured to transmit the microwave power generated by the oscillator to the periodic structure body,
wherein a matching part is located at a connecting portion between the periodic structure body and the transmitting part, and an impedance of the matching part has a value between an impedance of the periodic structure body and an impedance of the transmitting part,
wherein the matching part comprises a microstrip line having a dielectric body in which at least a portion of the periodic structure body is a ground surface, and
wherein the dielectric body of the microstrip line has a region of variation in a dielectric-constant, which forms an impedance-changing portion of the matching part.

10. The microwave processing device according to claim 9, wherein the periodic structure body comprises a first metallic plate having a first comb-shaped portion and a second metallic plate having a second comb-shaped portion that faces the first comb-shaped portion,
wherein the surface-wave transmission line is an interdigital line between the first and second comb-shaped portions,
wherein the transmitting part comprises a coaxial cable having a central conductor and a casing to cover the central conductor, and
wherein the central conductor of the coaxial cable is connected to the first comb-shaped portion of the periodic structure via the matching part, and the casing of the coaxial cable is connected to the second metallic plate of the periodic structure body.

11. The microwave processing device according to claim 10, further comprising an object table adjacent to the surface-wave transmission line and configured to support an object to be heated thereon,
wherein the periodic structure body is on a side of the object table opposite to a side that supports the object, and
wherein at least one of the matching part and the transmitting part are located on a side of the periodic structure body opposite to a side where the object and the object table are located.

12. The microwave processing device according to claim 9, further comprising an object table adjacent to the surface-wave transmission line and configured to support an object to be heated thereon,
wherein the periodic structure body is on a side of the object table opposite to a side that supports the object, and
wherein at least one of the matching part and the transmitting part are located on a side of the periodic structure body opposite to a side where the object and the object table are located.

* * * * *